US012628681B2

(12) United States Patent
Hagimoto et al.

(10) Patent No.: US 12,628,681 B2
(45) Date of Patent: May 12, 2026

(54) SEMICONDUCTOR MOUNTING MATERIAL FILLER AND METHOD FOR PRODUCING SEMICONDUCTOR MOUNTING MATERIAL FILLER, AND SEMICONDUCTOR MOUNTING MATERIAL

(71) Applicant: ADMATECHS CO., LTD., Miyoshi (JP)

(72) Inventors: Shinta Hagimoto, Miyoshi (JP); Nobutaka Tomita, Miyoshi (JP); Susumu Abe, Miyoshi (JP)

(73) Assignee: ADMATECHS CO., LTD., Miyoshi (JP)

( * ) Notice: Subject to any disclaimer, the term of this patent is extended or adjusted under 35 U.S.C. 154(b) by 405 days.

(21) Appl. No.: 18/206,789

(22) Filed: Jun. 7, 2023

(65) Prior Publication Data

US 2023/0352435 A1 Nov. 2, 2023

Related U.S. Application Data

(63) Continuation of application No. PCT/JP2021/045204, filed on Dec. 8, 2021.

(30) Foreign Application Priority Data

Dec. 10, 2020 (JP) ................................. 2020-205043

(51) Int. Cl.
*H10W 72/00* (2026.01)
*H10W 72/30* (2026.01)

(52) U.S. Cl.
CPC ......... *H10W 72/013* (2026.01); *H10W 72/30* (2026.01); *H10W 72/01351* (2026.01); *H10W 72/354* (2026.01)

(58) Field of Classification Search
CPC . H01L 24/27; H01L 24/29; H01L 2224/2711; H01L 2224/2919; H01L 2224/29387; H01L 23/295; C01B 33/18; C09D 17/00
See application file for complete search history.

(56) References Cited

U.S. PATENT DOCUMENTS

2016/0355685 A1* 12/2016 Ono ..................... H10H 20/854

FOREIGN PATENT DOCUMENTS

| | | |
|---|---|---|
| JP | S59-152215 A | 8/1984 |
| JP | S62-270415 A | 11/1987 |
| JP | H03-36761 A | 2/1991 |
| JP | H11-57451 A | 3/1999 |
| JP | 2000191316 A | 7/2000 |
| JP | 2000191317 A | 7/2000 |
| JP | 2002114510 A | 4/2002 |
| JP | 2003137533 A | 5/2003 |
| JP | 2004002059 A | 1/2004 |
| JP | 2004010420 A | 1/2004 |
| JP | 2004059343 A | 2/2004 |
| JP | 2004307269 A | 11/2004 |
| JP | 2005306923 A | 11/2005 |
| JP | 2007070159 A | 3/2007 |
| JP | 2009221054 A | 10/2009 |
| JP | 2014196521 A | 10/2014 |
| JP | 2015183173 A | 10/2015 |
| JP | 2016079278 A | 5/2016 |
| JP | 2017036168 A | 2/2017 |
| JP | 2017095291 A | 6/2017 |
| JP | 2017222569 A | 12/2017 |
| JP | 2018065722 A | 4/2018 |
| JP | 2019182715 A | 10/2019 |
| JP | 2020111474 A | 7/2020 |
| JP | 2022045619 A | 3/2022 |
| WO | WO-2018096876 A1 | 5/2018 |
| WO | WO-2019167618 A1 | 9/2019 |

OTHER PUBLICATIONS

Decision to Grant a Patent issued May 10, 2022 in Japanese Patent Application No. 2022-522231 (with English translation), 5 pages.
International Search Report issued Mar. 1, 2022 in PCT/JP2021/045204 (with English translation), 5 pages.
M.A. Dabbaghian et al., "A Parametric Study of the Synthesis of Silica Nanoparticles via Sol-Gel Precipitation Method", Int. J. Nanosci. Nanotechnol., vol. 6, No. 2, Jun. 2010, pp. 104-113.
Notice of Reasons for Revocation issued Mar. 20, 2023 in Japanese Patent No. 7082257 (with English translation), 45 pages.
Opposition to Grant of Patent issued Feb. 8, 2023 in Japanese Patent No. 7082257 (with English translation), 113 pages.
Opposition to Grant of Patent issued Feb. 8, 2023 in Japanese Patent No. 7082257 (with English translation), 132 pages.
Opposition to Grant of Patent issued Feb. 8, 2023 in Japanese Patent No. 7082257 (with English translation), 136 pages.

(Continued)

*Primary Examiner* — Anthony J Zimmer
*Assistant Examiner* — Syed T Iqbal
(74) *Attorney, Agent, or Firm* — Element IP, PLC

(57) ABSTRACT

Provided is a method for producing an electronic material filler having excellent performance. The method includes a burning step of putting a particle raw material in flame obtained by burning combustible carbon-free gas containing no carbon to form a particle material to be contained in the electronic material filler. By adopting, as combustible gas, combustible gas containing no carbon, conductive particles formed of carbon are not generated in principle. Therefore, a step of removing the conductive particles formed of carbon by sieving or the like is not required. Particularly, carbon derived from hydrocarbon gas is adhered to and formed on, for example, the surface of the particle material or is formed in the particle material. Therefore, the carbon may not be completely removed by sieving or the like. However, the production method of the present invention prevents the carbon from being mixed in principle.

5 Claims, No Drawings

(56) References Cited

OTHER PUBLICATIONS

Takashi Takebayashi, "Shape of Powder Particles", Journal of the Japan Society of Color Material, vol. 68, No. 1, 1995, pp. 52-58 (with English translation).

Written Opinion issued Mar. 1, 2022 in PCT/JP2021/045204 (with English translation), 7 pages.

Notice of Reasons for Revocation issued Aug. 28, 2023 in Japanese Patent Application No. 2022-522231 (with English machine translation), 70 pages.

Written Opinion of the Opponents 1-3 issued Aug. 28, 2023 in Japanese Patent Application No. 2022-522231 (with English machine translation), 76 pages.

Office Action issued May 23, 2024 in corresponding Japanese Patent No. 7082257 (with machine English translation), 63 pages.

* cited by examiner

SEMICONDUCTOR MOUNTING MATERIAL FILLER AND METHOD FOR PRODUCING SEMICONDUCTOR MOUNTING MATERIAL FILLER, AND SEMICONDUCTOR MOUNTING MATERIAL

TECHNICAL FIELD

The present invention relates to a semiconductor mounting material filler and a method for producing the semiconductor mounting material filler, and a semiconductor mounting material.

BACKGROUND ART

To date, for semiconductor mounting materials such as printed wiring board materials, electronic substrates, solder resist, interlayer insulating films, build-up materials, FPC adhesive, die-bonding materials, underfills, ACF, ACP, NCF, NCP, and sealing materials, a resin composition in which a particle material formed of an inorganic substance is dispersed in a resin material has been widely used. The semiconductor mounting material is brought into direct contact with a semiconductor, and is thus required to exhibit various performances such as electrical characteristics such as high insulating properties, and mechanical characteristics such as a small linear expansion coefficient, and the high performance is achieved by dispersing a particle material formed of an inorganic substance in a resin material (for example, Patent Literature 1).

As the particle material, a particle material (oxide particle material) formed of metal oxide is preferably adopted. Particularly, a particle material having high sphericity is preferably adopted since filling of the particle material is performed with high efficiency.

Examples of a method for producing a particle material having high sphericity include a so-called VMC method in which a particle material (metal particle material) formed of metal is put in flame and burned to produce a particle material formed of metal oxide, and a melting method in which a particle raw material formed of metal oxide is put in flame, melted, and cooled to produce a particle material.

In the VMC method, the metal particle material is explosively burned in flame, and the obtained metal oxide is vaporized and thereafter cooled, whereby an oxide particle material having extremely high sphericity is produced. The flame used at this time is formed by mixing a combustible gas such as propane and a supporting gas such as oxygen and burning the mixture.

A metal of a metal particle material used as a raw material in the VMC method is relatively easily refined, and an oxide particle material is also easily obtained so as to have high purity.

Meanwhile, in the melting method, a metal oxide particle material as a raw material is formed into spherical shapes by melting/cooling the metal oxide particle material, and, therefore, limitation on a raw material is reduced and the particle material is thus produced from various raw materials.

CITATION LIST

Patent Literature

Patent Literature 1: JP2020-111474 (A)

SUMMARY OF INVENTION

Technical Problem

However, in recent years, as semiconductors have fine sizes, a particle material dispersed in a semiconductor mounting material has been required to exhibit high performance. For example, in usage in which a semiconductor mounting material is brought into direct contact with a semiconductor having finer-size wiring, if particles (conductive particles) having electric conductivity are mixed as impurities, shortcircuiting may occur between adjacent wires, and, therefore, an amount of the conductive particles needs to be reduced. Therefore, the inventors of the present invention have attempted to further enhance purity also for oxide particle materials produced by the VMC method and the melting method.

The present invention has been completed in view of the aforementioned circumstances, and an object of the present invention for solving the aforementioned problem is to provide a semiconductor mounting material filler having more excellent performance than conventional art and a method for producing the semiconductor mounting material filler, and a semiconductor mounting material.

Solution to Problem

The inventors of the present invention have focused on a composition of combustible gas used for flame in the VMC method and the melting method, as a result of thorough study for solving the aforementioned problem. To date, hydrocarbon gas such as propane has been used as combustible gas for the VMC method and the melting method. Although the hydrocarbon gas is burned into carbon dioxide and water, a part of the hydrocarbon gas becomes carbon due to incomplete combustion or the like, and the carbon is mixed into a produced particle material. Therefore, the inventors have found that, in a case where combustible gas (carbon-free gas) containing no carbon, such as hydrogen and ammonia, is adopted instead of hydrocarbon gas as the combustible gas, conductive particles such as carbon are not generated even when incomplete combustion occurs.

Furthermore, the inventors have found that, particularly in a case where ammonia is adopted as carbon-free gas, a particle material having advantageous properties derived from the ammonia is produced.

The inventors of the present invention have completed the invention described below based on the above-described finding. That is, a method for producing a semiconductor mounting material filler according to the present invention for solving the aforementioned problem is a method for producing a semiconductor mounting material filler that contains a particle material and that is dispersed in a resin material to form a semiconductor mounting material, in which a metal oxide is contained as a main component, and, in the metal oxide, a number of colored foreign objects that contain carbon and that are not less than 20 μm, is not greater than 10 in a supernatant liquid obtained when a dispersion liquid having 50 g of the metal oxide dispersed in 400 mL of ethanol is irradiated with 300 W ultrasound at 38 kHz for 20 minutes and is thereafter left as it is for 24 hours, and the metal oxide has a volume average particle diameter of not less than 0.1 μm and not greater than 40 μm, and a sphericity of not less than 0.85, and the method includes a spherical shape forming step of putting and burning and/or melting a particle raw material that contains, as a main component, metal contained in the metal oxide and/or the metal oxide, in flame obtained by burning combustible gas that contains 20% or more by volume of combustible carbon-free gas containing no carbon, to form the particle material.

In a case where the content of carbon-free gas contained in combustible gas is not less than 20% by volume, generation of conductive particles formed of carbon is reduced in principle. Particularly, in a case where the entirety of the combustible gas is formed of carbon-free gas, conductive particles are not generated in principle. Therefore, a step of removing the conductive particles formed of carbon by sieving or the like is not required or removal of the conductive particles is facilitated. Particularly, carbon derived from hydrocarbon gas is adhered to and formed on, for example, the surface of the produced particle material or is formed in the particle material. Therefore, the carbon may not be completely removed by sieving or the like. However, the production method of the present invention prevents or inhibits the carbon from being mixed in principle.

Furthermore, in the method for producing the particle material according to the present invention, the accompanying effects described below are also exhibited particularly in a case where ammonia is adopted as carbon-free gas.

A first accompanying effect that a particle material having small particle diameters is contained, is exhibited. In a case where the particle material having small particle diameters is contained, fluidity is enhanced. Since an amount of heat generated by ammonia through burning is less than that of hydrocarbon gas, a volume needs to be increased as compared with hydrocarbon gas in order to generate an equivalent amount of heat. As a result, the size of flame is increased, and the particle raw material is assuredly burned, thereby enhancing the sphericity of the produced particle material. Furthermore, the temperature of flame formed by ammonia becomes low, and progress of particle growth in the flame is retarded, so that a particle material having small particle diameters is contained.

A second accompanying effect that, in a case where a particle material is formed of silica, a Si—N bond is introduced into the particle material, is exhibited. Although the Si—N bond has binding energy equivalent to that of a Si—O bond that is a main bond in silica, the number of binding moieties of O is 2 whereas the number of binding moieties of N is 3, and relative binding energy per unit mass (or unit volume) of the particle material is enhanced. Thus, hardness of the particle material, a refractive index, and acid resistance and alkali resistance are expected to be enhanced.

A third accompanying effect is as follows. That is, an amount of water generated per unit heat amount of combustible gas is relatively increased, so that the number of hydroxy groups on the surface of the metal oxide particle material is increased. Thus, increase of the number of reaction points for surface treatment by a coupling agent or the like, or enhancement of adhesiveness with respect to resin are expected.

A particle material of the present invention for solving the aforementioned problem contains, as a main component, a metal oxide in which a number of colored foreign objects that contain carbon and that are not less than 20 μm, is not greater than 10 in a supernatant liquid obtained when a dispersion liquid having 50 g of the metal oxide dispersed in 400 mL of ethanol is irradiated with 300 W ultrasound at 38 kHz for 20 minutes and is thereafter left as it is for 24 hours, and the particle material is naturally precipitated, the metal oxide having a volume average particle diameter of not less than 0.1 μm and not greater than 40 μm, and a sphericity of not less than 0.85.

The colored foreign objects have colors different from a color of a normal metal oxide particle material. The colored foreign objects are determined by the outer appearance through a microscope. Specifically, whether or not the object is colored as compared with a particle material contained in precipitation from which the supernatant liquid has been separated, is determined. The particle diameters of the colored foreign objects are preferably not greater than twice the volume average particle diameter of the particle material. Whether carbon is present or absent is determined by energy dispersive X-ray spectroscopy (EDX) Carbon is determined to be contained in a case where a content of carbon element detected by EDX is not less than 1 atom %. Particularly, in the description herein, carbon to be prevented from being contained is soot, graphite, and the like having electric conductivity. In order to determine whether carbon is present or absent, carbon in the form of soot or graphite is preferably detected to determine whether carbon is present or absent.

In the VMC method and the melting method widely used as a method for producing a particle material formed of metal oxide, a particle raw material formed of metal or metal oxide is put in flame to produce the particle material, and hydrocarbon gas such as propane is used as combustible gas for forming the flame, so that colored foreign objects containing carbon derived from the hydrocarbon gas is inevitably mixed.

DESCRIPTION OF EMBODIMENTS

A semiconductor mounting material filler and a method for producing the semiconductor mounting material filler, and a semiconductor mounting material according to the present invention are described below in detail based on an embodiment. The semiconductor mounting material filler of the present embodiment is dispersed and used in a resin material. Examples of the semiconductor mounting material include printed wiring board materials, electronic substrates, solder resist, interlayer insulating films, build-up materials, FPC adhesive, die-bonding materials, underfills, ACF, ACP, NCF, NCP, and sealing materials. In the description herein, the "particle diameter" represents a volume average particle diameter for an aggregate of particle materials, and represents a particle diameter of each particle material in a case where an individual particle material is referred to.
(Semiconductor Mounting Material Filler and Semiconductor Mounting Material)

The semiconductor mounting material filler of the present embodiment is dispersed in a resin material to form a semiconductor mounting material. A part or the entirety of the semiconductor mounting material filler of the present embodiment is formed by a particle material described below. The resin material is, but is not particularly limited to, for example, epoxy resin or silicone resin. Particularly, thermosetting resin which has not been cured is preferably adopted. The content of the semiconductor mounting material filler contained in the resin material is preferably about 20% to 92%, more preferably about 40% to 90%, and even more preferably about 60% to 88% with respect to the total mass.

The particle material (hereinafter, simply referred to as "particle material of the present embodiment") of the semiconductor mounting material filler of the present embodiment contains metal oxide as a main component. Examples of the metal oxide include silica, alumina, titania, zirconia, and mixtures and complex oxide thereof. Particularly, the content of silica is not less than 50%, not less than 60%, not less than 70%, not less than 80%, not less than 90%, not less than 95%, or not less than 99% with respect to the total mass, and the entirety of the particle material is more preferably formed of silica except for inevitable impurities.

In a case where silica is contained as the metal oxide, the particle material preferably has an Si—N bond. Whether an Si—N bond is present or absent is determined according to whether or not nitrogen element is contained. Although the content of the nitrogen element is not particularly limited, an Si—N bond is determined to be present when the content of the nitrogen element is not less than 0.1 at % with respect to the total mass of the particle material.

The particle material of the present embodiment has a volume average particle diameter of not less than 0.1 μm and not greater than 40 μm. The volume average particle diameter is measured by laser diffraction. The upper limit value of the volume average particle diameter is preferably 40 μm, 20 μm, 10 μm, or 5 μm. The lower limit value is preferably 0.1 μm, 0.3 μm, 0.5 μm, or 2 μm. Combination of the upper limit value and the lower limit value is discretionary.

The sphericity of the particle material of the present embodiment is preferably not less than 0.85, not less than 0.88, not less than 0.90, not less than 0.95, or not less than 0.97. As the sphericity, a value measured by using an image analyzer FPIA-3000 (manufactured by SYSMEX CORPORATION) is adopted.

The particle material may be a surface-treated particle material. The surface of the particle material has advantageous properties through the surface treatment. For example, in a case where the particle material is mixed in the resin material, the particle material is caused to have hydrophobicity (phenyl group, hydrocarbon group, or the like), or a functional group (vinyl group, epoxy group, acrylic group, methacrylic group, or the like) having reactivity with resin is introduced, in order to enhance affinity for the resin material. Although a surface-treated amount is not particularly limited, the surface treatment is performed so as to achieve target properties. In a case where a surface treatment agent is a substance that reacts with functional groups (OH group or the like) on a surface of a filler material, an amount of the surface treatment agent is selected (for example, an amount corresponding to the total amount of the functional groups on the surface, half an amount of the functional groups on the surface, or twice an amount of the functional groups on the surface) according to an amount of the functional groups on the surface of the filler material.

As the surface treatment agent for performing the surface treatment, a silane compound may be adopted. Examples of the silane compound include a so-called silane coupling agent having SiH, SiOH, or SiOR (R represents a hydrocarbon group), and silazanes such as hexamethylene disilazane, and the silane compound is, for example, a substance in which any functional group is bound to Si of a silane compound.

Examples of said any functional group include hydrocarbon groups (alkyl groups (such as methyl group, ethyl group, propyl group, and butyl group)), alkenyl groups (such as vinyl group, ethenyl group, and propenyl group), a phenyl group, an amino group, a phenylamino group, an acrylic group, a methacrylic group, an epoxy group, a styryl group, silicone, and combinations thereof. As the silane compound, one kind of silane compound is used for the treatment or two or more kinds of silane compounds are used in combination for the treatment. In a case where two or more kinds of silane compounds are used in combination for the surface treatment, for example, a plurality of kinds of surface treatment agents are mixed and the surface treatment is performed, or a plurality of kinds of surface treatment agents are used to sequentially perform the surface treatment.

The particle material of the present embodiment preferably has a crystallinity of not greater than 3%. The crystallinity is calculated from an area of a peak derived from a crystalline portion and an area of a peak derived from an amorphous portion based on a spectrum measured by XRD. The peak derived from the crystalline portion is derived from the Powder Diffraction File provided by the International Centre for Diffraction Data.

In the particle material of the present embodiment, the number of colored foreign objects which are not less than 20 μm when measured by a method described below is preferably not greater than 10 objects/50 g, not greater than 8 objects/50 g, not greater than 6 objects/50 g, not greater than 4 objects/50 g, or not greater than 2 objects/50 g. The upper limit value of the number of the colored foreign objects may be greater than the above-described value. For example, the results of comparative examples indicate that, even when the upper limit value is not greater than 30 objects/50 g, not greater than 25 objects/50 g, not greater than 20 objects/50 g, or not greater than 15 objects/50 g, sufficient performance is assumed to be exhibited.

The number of the colored foreign objects is measured in a manner in which, when a dispersion liquid having 50 g of the particle material dispersed in 400 mL of ethanol as a dispersion medium is irradiated with 300 W ultrasound at 38 kHz for 20 minutes, and is thereafter left as it is for 24 hours, a supernatant liquid is filtered through a nylon mesh screen having 20 μm opening, and the number of foreign objects left on the screen is measured as the number of the colored foreign objects. Whether or not the colored foreign objects contain carbon is determined by the above-described method.

(Method for Producing Particle Material)

A particle material produced by the method for producing the particle material according to the present embodiment is the above-described particle material according to the present embodiment. Therefore, description about the produced particle material is omitted. The method for producing the particle material according to the present embodiment includes a spherical-shape forming step of putting, and burning and/or melting a particle raw material in flame. The particle raw material is formed of a metal corresponding to a kind of a metal oxide that forms the particle material to be produced and/or the metal oxide. For example, in a case where the metal oxide is silica, the particle raw material contains metallic silicon, contains silica, or contains both metallic silicon and silica. The production method of the present embodiment is performed in a furnace that has an appropriate size and that is formed of an appropriate material. Particles formed of carbon are preferably prevented from being left in the furnace.

A combustible gas used as fuel is a gas that reacts with a supporting gas such as oxygen to form flame having a temperature higher than a temperature at which a metal oxide is melted and a temperature at which reaction with a metal as a raw material of the metal oxide is caused.

As a part or the entirety of the combustible gas, a carbon-free gas such as hydrogen or ammonia is adopted. The content of the carbon-free gas is not less than 20%, preferably not less than 40%, more preferably not less than 60%, even more preferably not less than 80%, and particularly 100% with respect to the total volume of the combustible gas.

In a case where hydrogen and ammonia are adopted as the carbon-free gas, hydrogen and ammonia are each used alone, or a mixture of hydrogen and ammonia is used. That is, a hydrogen:ammonia ratio in the carbon-free gas is discretionarily set in a range of 10:0 to 0:10. For example, hydrogen and ammonia are mixed at a ratio of, for example, 9:1, 8:2, 7:3, 6:4, 5:5, 4:6, 3:7, 2:8, or 1:9. The carbon-free gas containing no carbon, other than hydrogen and ammonia, may be contained.

The particle raw material obtained by granulating a metal or a metal oxide with use of an atomizer, a grinder, a granulator, or the like may be adopted. For example, a raw material is heated and melted, and is thereafter formed into particulates by using an atomizer. A material larger than the particle raw material is ground to obtain the particle raw material. A material having a particle diameter less than that of the particle raw material is granulated so as to have a target size. In a case where the granulation is performed, a binding agent containing no carbon is preferably adopted. For example, a dispersion liquid having the material dispersed in water is sprayed and dried, whereby granulation using no binding agent is possible.

The particle raw material may be subjected to surface treatment described above for the particle material in order to, for example, enhance fluidity of the particle raw material. Although a particle diameter of the particle raw material is not particularly limited, a particle diameter distribution that is substantially equivalent to a particle diameter distribution for the particle material to be produced is adopted. D90/D10 is preferably not greater than 3 and more preferably not greater than 2. D10 and D90 represent particle diameters at 10% and 90%, respectively, of accumulation from the smallest particle diameter in terms of volume.

Flame is formed by mixing a supporting gas containing oxygen with the combustible gas, and burning the mixture. A temperature of a refractory structure of a furnace as an indicator of a temperature in the furnace is set to be not lower than 900° C. and not higher than 1500° C. at a position (furnace body temperature) at which the refractory structure has the highest temperature. For the furnace body temperature, 900° C., 1000° C., or 1100° C. is adopted as the lower limit value, and 1500° C., 1400° C., or 1300° C. is adopted as the upper limit value. Combination of the upper limit value and the lower limit value is discretionary. As the supporting gas, air or oxygen is adopted. The combustible gas and the supporting gas are separately supplied or are supplied in a previously mixed state, when supplied into the furnace. In a case where the combustible gas and the supporting gas are separately supplied, the combustible gas is supplied into an inner tube of a double tube, and the supporting gas is supplied into an outer tube thereof. A flow rate of the combustible gas is preferably not less than 10 m/s, more preferably not less than 15 m/s, and even more preferably not less than 20 m/s. A flow rate of the supporting gas is preferably not less than 10 m/s, more preferably not less than 15 m/s, and even more preferably not less than 20 m/s. A combustible gas/supporting gas flow rate ratio is preferably not greater than 2.0, more preferably not greater than 1.5, and even more preferably not greater than 1.0. A supply amount of the combustible gas is such an amount of combustible gas as to form flame having a size that allows the supplied particle raw material to be sufficiently heated, and a supply amount of the supporting gas is such an amount of supporting gas as to sufficiently burn the combustible gas. For example, the amount of the combustible gas is about 0.5 $Nm^3/kg$ to 5 $Nm^3/kg$ with respect to a unit weight of the particle raw material to be processed, and the amount of oxygen as the supporting gas is about 1 $Nm^3/kg$ to 5 $Nm^3/kg$ with respect to the unit weight of the particle raw material to be processed. In a case where the particle raw material contains metal (that is, VMC method), oxidizing flame is used as flame.

Furthermore, air or the like is preferably supplied around flame as a sheath gas. The sheath gas allows the shape of the flame to be controlled, allows influence of the flame on the furnace to be reduced, and allows the obtained particle material to be immediately cooled. As the flow rate of the sheath gas, about 5 $Nm^3/kg$, about 20 $Nm^3/kg$, or about 40 $Nm^3/kg$ with respect to a unit weight of the particle raw material is adopted. When multiple stages of blowing inlets for the sheath gas are disposed, the flow rate is discretionarily adjusted to an appropriate flow rate for each height.

Although a method for supplying the particle raw material into flame is not particularly limited, for example, the particle raw material is dispersed in a carrier gas and supplied into flame. Examples of the carrier gas include air, oxygen, and nitrogen.

Although a concentration at which the particle raw material is dispersed in the carrier gas is not particularly limited, the particle raw material is dispersed preferably at about 0.5 $kg/Nm^3$ to 8.0 $kg/Nm^3$, more preferably at about 1.0 $kg/Nm^3$ to 6.0 $kg/Nm^3$, and even more preferably at about 1.5 $kg/Nm^3$ to 4.0 $kg/Nm^3$.

The produced particle material is classified and collected by using a bag filter or a cyclone.

The obtained particle material may be subjected to surface treatment by using the above-described surface treatment agent.

(Semiconductor Mounting Material Filler and Semiconductor Mounting Material)

The semiconductor mounting material of the present embodiment is a material in which the semiconductor mounting material filler of the present embodiment is dispersed in a resin material. The above-described particle material of the present embodiment may be adopted as a part or the entirety of the semiconductor mounting material filler of the present embodiment. The resin material is, but is not particularly limited to, for example, epoxy resin or silicone resin. Particularly, thermosetting resin which has not been cured is preferably adopted. The content of the semiconductor mounting material filler contained in the resin material is preferably about 20% to 92%, more preferably about 40% to 90%, and even more preferably about 60% to 88% with respect to the total mass.

EXAMPLES

The semiconductor mounting material filler and the method for producing the semiconductor mounting material filler, and the semiconductor mounting material according to the present invention are described below in detail based on examples.

(Production of Particle Material of Semiconductor Mounting Material Filler)

Crystalline Crushed Silica as Particle Raw
Material, and Ammonia as Combustible Gas Example 1

As the combustible gas, only ammonia as carbon-free gas was used. As the particle raw material, crystalline crushed silica (silica A: volume average particle diameter of 12.3 μm) was used. As carrier gas, oxygen was used.

A supply amount of the silica A was 20.2 kg/h, a supply amount of ammonia was 32.1 Nm³/h, and an amount of oxygen used as the supporting gas was 33.0 Nm³/h. The obtained particle material was collected by using a cyclone and a bag filter, and used as a test sample of Example 1.

The obtained test sample was analyzed. As a result, the sphericity was 0.95, and the number of colored foreign objects that were not less than 20 μm was 4. A volume average particle diameter of the obtained test sample was 15.6 μm. The melting degree was 94.0%.

The number of the colored foreign objects was measured by the method described in the embodiment. According to EDX, the colored foreign objects were determined to contain carbon atoms. However, carbon atoms were not contained in the particle raw material, the combustible gas, the supporting gas, the carrier gas, and the like. Therefore, particles formed of carbon existing originally in the facility were assumed to be mixed. The same applies to Example 2 described below. For the melting degree of silica, a peak derived from a crystalline portion and a halo derived from an amorphous portion based on a spectrum measured by XRD were separated, and, based on the ratio therebetween, a proportion of the amorphous portion with respect to the entirety was set as the melting degree. The melting degree of alumina was calculated by the following equation.

$$\text{(Melting degree of alumina)} = \{1 - (S1 - S2)/(S3 - S2)\} \times 100(\%)$$

S1: BET specific surface area of each test example
S2: specific surface area ($=6/\rho d$) derived from particle diameter
  D50 value of each test example on the assumption of an ideal perfect spherical particle.
S3: BET specific surface area of raw material particle
ρ: true specific gravity of alumina
d: particle diameter D50 value of each test example Example 2

A particle material was produced in the same manner as in Example 1 except that a supply amount of the silica A was 15.0 kg/h and a supply amount of a supporting gas was 28.0 Nm³/h.

The obtained test sample was analyzed. As a result, the sphericity was 0.96, and the number of colored foreign objects that were not less than 20 μm was 3. A volume average particle diameter of the obtained test sample was 14.3 μm. The melting degree was 93.7%.

Example 3

A particle material was produced in the same manner as in Example 1 except that a supply amount of the silica A was 10.3 kg/h and a supply amount of a supporting gas was 28.0 Nm³/h.

The obtained test sample was analyzed. As a result, the sphericity was 0.97, and the number of colored foreign objects that were not less than 20 μm was 0. A volume average particle diameter of the obtained test sample was 14.9 μm. The melting degree was 96.7%.

Crystalline Crushed Silica as Particle Raw
Material, and Ammonia and Hydrogen as
Combustible Gas Example 4

A particle material was produced in the same manner as in Example 1 except that a supply amount of the silica A was 9.8 kg/h, a supply amount of ammonia was 25.7 Nm³/h and a supply amount of hydrogen was 8.6 Nm³/h instead of only ammonia being supplied, and a supply amount of a supporting gas was 28.0 Nm³/h.

The obtained test sample was analyzed. As a result, the sphericity was 0.96, and the number of colored foreign objects that were not less than 20 μm was 0. A volume average particle diameter of the obtained test sample was 13.6 μm. The melting degree was 94.0%.

Example 5

A particle material was produced in the same manner as in Example 4 except that a supply amount of the silica A was 19.3 kg/h, a supply amount of ammonia was 16.1 Nm³/h, a supply amount of hydrogen was 21.1 Nm³/h, and a supply amount of a supporting gas was 25.0 Nm³/h.

The obtained test sample was analyzed. As a result, the sphericity was 0.96, and the number of colored foreign objects that were not less than 20 μm was 0. A volume average particle diameter of the obtained test sample was 15.4 μm. The melting degree was 95.3%.

Crystalline Crushed Silica as Particle Raw
Material, and Propane as Combustible Gas Comparative Example 1

A particle material was produced in the same manner as in Example 1 except that only propane was used instead of ammonia as combustible gas, a supply amount of propane was 5.0 Nm³/h, and a supply amount of a supporting gas was 28.0 Nm³/h. An amount of heat generated by flame per unit mass of the raw material was equal to that in Example 1.

The obtained test sample was analyzed. As a result, the sphericity was 0.97, and the number of colored foreign objects that were not less than 20 μm was 22. The volume average particle diameter of the obtained test sample was 15.1 μm. When elements contained in the colored foreign objects having been separated, were examined by SEM-EDX analysis, particles which appeared to be soot having indefinite shapes and which contained C as a main component and O, and particles which appeared to be a mixture of soot and silica and which contained O as a main component and Si and C, were observed.

Comparative Example 2

A particle material was produced in the same manner as in Comparative example 1 except that a supply amount of the silica A was 20.3 kg/h and a supply amount of a supporting gas was 25.0 Nm³/h.

The obtained test sample was analyzed. As a result, the sphericity was 0.95, and the number of colored foreign objects that were not less than 20 μm was 31. The volume average particle diameter of the obtained test sample was 14.8 μm.

Crystalline Crushed Silica (Small Particle Diameter) as Particle Raw Material, and Ammonia as Combustible Gas

Example 6

A particle material was produced in the same manner as in Example 1 except that crystalline crushed silica (silica B) having a volume average particle diameter of 5.3 μm was used instead of the silica A, and a supply amount of the silica B was 10.0 kg/h.

The obtained test sample was analyzed. As a result, the sphericity was 0.95, and the number of colored foreign objects that were not less than 20 μm was 3. The volume average particle diameter of the obtained test sample was 6.5 μm. The melting degree was 92.8%.

Crystalline Crushed Silica (Small Particle Diameter) as Particle Raw Material, and Propane as Combustible Gas

Comparative Example 3

A particle material was produced in the same manner as in Example 6 except that a supply amount of the silica B was 16.4 kg/h, only propane was used instead of ammonia as combustible gas, and a supply amount of propane was 5.0 Nm$^3$/h.

The obtained test sample was analyzed. As a result, the sphericity was 0.96, and the number of colored foreign objects that were not less than 20 μm was 16. The volume average particle diameter of the obtained test sample was 6.4 μm. The melting degree was 96.7%.

Alumina as Particle Raw Material, and Ammonia as Combustible Gas

Example 7

A particle material was produced in the same manner as in Example 2 except that crushed alumina (alumina A) having a volume average particle diameter of 57.6 μm was used instead of the silica A, and a supply amount of the alumina A was 10.0 kg/h.

The obtained test sample was analyzed. As a result, the sphericity was 0.96, and the number of colored foreign objects that were not less than 20 μm was 5. The volume average particle diameter of the obtained test sample was 35.9 μm. The melting degree was 70.4%.

Alumina as Particle Raw Material, and Propane as Combustible Gas

Comparative Example 4

A particle material was produced in the same manner as in Example 7 except that a supply amount of the alumina A was 16.4 kg/h, only propane was used instead of ammonia as combustible gas, and a supply amount of propane was 5.0 Nm$^3$/h.

The obtained test sample was analyzed. As a result, the sphericity was 0.96, and the number of colored foreign objects that were not less than 20 μm was 19. The volume average particle diameter of the obtained test sample was 45.5 μm. The melting degree was 76.2%.

Crystalline Crushed Silica as Particle Raw Material, and Hydrogen as Combustible Gas

Example 8

A particle material was produced in the same manner as in Example 1 except that a supply amount of the silica A was 5.0 kg/h, only hydrogen was used instead of ammonia, a supply amount of hydrogen was 48.5 Nm$^3$/h, and a supply amount of a supporting gas was 25.5 Nm$^3$/h.

The obtained test sample was analyzed. As a result, the sphericity was 0.97, and the number of colored foreign objects that were not less than 20 μm was 0. The volume average particle diameter of the obtained test sample was 14.8 μm. The melting degree was 96.9%.

Table 1 indicates the results of the examples and the comparative examples. If the description and the contents of the table are different from each other and the difference is not particularly significant, the contents of the table are preferentially referred to.

TABLE 1

| Item | | Unit | Ex. 1 | Ex. 2 | Ex. 3 | Ex. 4 | Ex. 5 |
|---|---|---|---|---|---|---|---|
| Supply amount of particle raw material | Silica A | kg/h | 20.2 | 15.0 | 10.3 | 9.8 | 19.3 |
| | Silica B | kg/h | | | | | |
| | Alumina A | kg/h | | | | | |
| Supply amount of combustible gas | Propane | Nm$^3$/h | | | | | |
| | Ammonia | Nm$^3$/h | 32.1 | 32.1 | 32.1 | 25.7 | 16.1 |
| | Hydrogen | Nm$^3$/h | | | | 8.6 | 21.1 |
| Supply amount of supporting gas | Oxygen | Nm$^3$/h | 33.0 | 28.0 | 28.0 | 28.0 | 25.0 |
| Physical properties of particle formed in spherical shape | Particle diameter | μm | 15.6 | 14.3 | 14.9 | 13.6 | 15.4 |
| | Roundness | — | 0.95 | 0.96 | 0.97 | 0.96 | 0.96 |
| | Melting degree | % | 94.0 | 93.7 | 96.7 | 94.0 | 95.3 |
| | Floating black foreign objects | The number of objects/ 50 g | 4 | 3 | 0 | 0 | 3 |

TABLE 1-continued

| Item | | Unit | Comp. Ex. 1 | Comp. Ex. 2 | Ex. 6 | Comp. Ex. 3 | Ex. 7 | Comp. Ex. 4 | Ex. 8 |
|---|---|---|---|---|---|---|---|---|---|
| Supply amount of particle raw material | Silica A | kg/h | 18.7 | 20.3 | | | | | 5.0 |
| | Silica B | kg/h | | | 10 | 16.4 | | | |
| | Alumina A | kg/h | | | | | 10.0 | 16.4 | |
| Supply amount of combustible gas | Propane | Nm³/h | 5.0 | 5.0 | | 5.0 | | 5.0 | |
| | Ammonia | Nm³/h | | | 32.1 | | 32.1 | | |
| | Hydrogen | Nm³/h | | | | | | | 48.5 |
| Supply amount of supporting gas | Oxygen | Nm³/h | 28.0 | 25.0 | 33.0 | 33.0 | 28.0 | 28.0 | 25.5 |
| Physical properties of particle formed in spherical shape | Particle diameter | μm | 15.1 | 14.8 | 6.5 | 6.4 | 35.9 | 45.5 | 14.8 |
| | Roundness | — | 0.97 | 0.95 | 0.93 | 0.96 | 0.96 | 0.96 | 0.97 |
| | Melting degree | % | 97.0 | 93.8 | 92.8 | 96.7 | 70.4 | 76.2 | 96.9 |
| | Floating black foreign objects | The number of objects/ 50 g | 22 | 31 | 3 | 16 | 5 | 19 | 1 |

Review

In the test samples of the examples in which gas containing no carbon was adopted as combustible gas, the number of colored foreign objects was found to be very small as compared with the test samples of the comparative examples in which propane containing carbon was adopted as combustible gas. This is considered to be because use of carbon-free gas as combustible gas did not cause generation of impurities formed of carbon.

In Examples 1 and 2 and 5 to 7, the colored foreign objects having been observed may not necessarily contain carbon regardless of whether or not the particle diameter thereof was less than 20 μm, and the colored foreign objects were assumed to be particles derived from the experiment facilities such as the furnace body, the bag filter, or the cyclone, impurities in the particle raw material, or products altered from the particle raw material, regardless of whether or not carbon was contained.

The invention claimed is:

1. A method for producing a semiconductor mounting material filler that contains a particle material and that is dispersed in a resin material to form a semiconductor mounting material, wherein a metal oxide is contained as a main component, and, in the metal oxide, a number of colored foreign objects that contain carbon and that are not less than 20 μm, is not greater than 10 in a supernatant liquid obtained when a dispersion liquid having 50 g of the metal oxide dispersed in 400 mL of ethanol is irradiated with 300 W ultrasound at 38 kHz for 20 minutes and is thereafter left as it is for 24 hours, and the metal oxide has a volume average particle diameter of not less than 0.1 μm and not greater than 40 μm, and a sphericity of not less than 0.85, the method comprising a spherical shape forming step of putting and burning and/or melting a particle raw material that contains, as a main component, metal contained in the metal oxide and/or the metal oxide, in flame obtained by burning combustible gas that contains 20% or more by volume of combustible carbon-free gas containing no carbon, to form the particle material.

2. The method for producing a semiconductor mounting material filler according to claim 1, wherein the particle raw material has the metal oxide.

3. The method for producing a semiconductor mounting material filler according to claim 1, wherein a content of the carbon-free gas in the combustible gas is 100%.

4. The method for producing a semiconductor mounting material filler according to claim 1, wherein the carbon-free gas is ammonia and/or hydrogen.

5. The method for producing a semiconductor mounting material filler according to claim 1, wherein the metal oxide is silica.

* * * * *